(12) United States Patent
Shin et al.

(10) Patent No.: US 11,585,848 B1
(45) Date of Patent: Feb. 21, 2023

(54) APPARATUS FOR TESTING SEMICONDUCTOR DEVICE

(71) Applicant: EXICON CO., LTD., Seongnam-si (KR)

(72) Inventors: Jong Kyoung Shin, Suwon-si (KR); Ji Man Park, Namyangju-si (KR)

(73) Assignee: EXICON CO., LTD., Suwon-si (KR)

( * ) Notice: Subject to any disclaimer, the term of this patent is extended or adjusted under 35 U.S.C. 154(b) by 0 days.

(21) Appl. No.: 17/547,383

(22) Filed: Dec. 10, 2021

(30) Foreign Application Priority Data

Dec. 8, 2021 (KR) .......................... 10-2021-0174424

(51) Int. Cl.
*G01R 31/28* (2006.01)
*G01R 1/073* (2006.01)

(52) U.S. Cl.
CPC ..... *G01R 31/2889* (2013.01); *G01R 1/07342* (2013.01); *G01R 31/2879* (2013.01)

(58) Field of Classification Search
CPC ............ G01R 1/07307; G01R 1/07342; G01R 1/0408; G01R 31/2808; G01R 31/2818; G01R 31/66
See application file for complete search history.

(56) References Cited

U.S. PATENT DOCUMENTS

2012/0194213 A1* 8/2012 Komatsu ............ G01R 31/2887
324/756.03
2013/0265073 A1* 10/2013 Nakano .................... G01R 3/00
29/831

* cited by examiner

*Primary Examiner* — Tung X Nguyen
(74) *Attorney, Agent, or Firm* — Harness, Dickey & Pierce, P.L.C.

(57) ABSTRACT

A semiconductor device test apparatus for improving a loss rate of a test signal in testing a device under test is provided. The semiconductor device test apparatus includes a probe interface board, a pogo block disposed on the probe interface board and electrically connected to a device under test, an equipment board disposed under the probe interface board, an alternating current (AC) controller, transferring and receiving an AC signal for performing an AC test on at least one of the device under test and the pogo block, being mounted on the equipment board, and a physical layer equalizing (PLE) board disposed between the probe interface board and the equipment board, a first equalizing circuit, decreasing loss of the AC signal, being mounted on the PLE board.

11 Claims, 5 Drawing Sheets

APPARATUS FOR TESTING SEMICONDUCTOR DEVICE

CROSS-REFERENCE TO RELATED APPLICATIONS

This application claims the benefit of the Korean Patent Application No. 10-2021-0174424 filed on Dec. 8, 2021, which is hereby incorporated by reference as if fully set forth herein.

FIELD OF THE INVENTION

The present invention relates to an apparatus for testing a semiconductor device, and more particularly, to a System on Chip test apparatus.

BACKGROUND

As semiconductor devices advance, an important issue for accurately and quickly testing semiconductor devices is progressively increasing. Recently, the use of a System on Chip (hereinafter referred to as an SoC), into which a system and a product capable of complete driving are embedded, increases, and thus, semiconductor device test apparatuses for more quickly and accurately testing SoCs are needed.

In terms of securing reliability, semiconductor device test apparatuses for testing an SoC perform various kinds of performance tests so as to verify an electrical characteristic and a physical characteristic of the SoC before the SoC is released. In detail, the semiconductor device test apparatuses may connect an input/output terminal of an SoC to a test signal generating circuit to perform various performance tests such as an electrical characteristic test, a function test, and a reliability evaluation of the SoC.

The semiconductor device test apparatuses described above may apply various test signals to an SoC, receive a response signal fed back from the SoC on the basis of a test signal being applied thereto, and compare an expectation value with the response signal, thereby testing the occurrence or not of a defect in the SoC. As described above, the semiconductor device test apparatuses may perform a test on an SoC before being released, and thus, may detect and remove an SoC where a defect thereof has been detected, thereby enhancing the reliability of a product.

However, in general semiconductor device test apparatuses, noise or jitter may occur in a test signal, which is transmitted to an SoC so as to test the SoC, or a response signal which is fed back from the SoC, and thus, a signal loss rate may increase, causing a problem where the accuracy of an SoC test result is reduced.

SUMMARY

Accordingly, the present disclosure is directed to providing an apparatus for testing a semiconductor device that substantially obviates one or more problems due to limitations and disadvantages of the related art.

An aspect of the present disclosure is directed to providing a semiconductor device test apparatus for improving a loss rate of a test signal in testing a device under test.

Another aspect of the present disclosure is directed to providing a semiconductor device test apparatus in which a plurality of physical layer equalizing (PLE) boards for improving a loss rate of a test signal may be mounted in a limited space.

Another aspect of the present disclosure is directed to providing a semiconductor device test apparatus for testing a coupling state of a pogo block.

Another aspect of the present disclosure is directed to providing a semiconductor device test apparatus in which an alternating current (AC) test signal for an AC test is prevented from flowing into a direct current (DC) signal relay circuit for a DC test.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a semiconductor device test apparatus including: a probe interface board; a pogo block disposed on the probe interface board and electrically connected to a device under test; an equipment board disposed under the probe interface board, an alternating current (AC) controller, transferring and receiving an AC signal for performing an AC test on at least one of the device under test and the pogo block, being mounted on the equipment board; and a physical layer equalizing (PLE) board disposed between the probe interface board and the equipment board, a first equalizing circuit, decreasing loss of the AC signal, being mounted on the PLE board.

The semiconductor device test apparatus may further include an edge connector coupled to a bottom surface of the probe interface board, wherein the PLE board may be inserted into the edge connector in a direction vertical to the probe interface board.

The PLE board may be provided in plurality, and the plurality of PLE boards may be grouped by predetermined number units and are disposed in a symmetrical structure with respect to a center of the probe interface board.

A through hole having a tetragonal shape may be formed in a center of the probe interface board, the plurality of PLE boards may be grouped into a first PLE board group, a second PLE board group, a third PLE board group, and a fourth PLE board group, the first PLE board group may be coupled to a first region which is an outer portion of a first side of the through hole in the probe interface board, a second PLE board group may be coupled to a second region which is an outer portion of a second side of the through hole in the probe interface board, a third PLE board group may be coupled to a third region which is an outer portion of a third side of the through hole in the probe interface board, and a fourth PLE board group may be coupled to a fourth region which is an outer portion of a fourth side of the through hole in the probe interface board.

The semiconductor device test apparatus may further include a heat dissipation fan disposed between the plurality of PLE boards and the equipment board to dissipate heat of a PLE board included in a corresponding group for each group.

The first equalizing circuit may be a filter circuit reducing jitter or noise of the AC signal.

The AC controller may include: a first control unit generating a first AC signal, which is to be applied to at least one of the device under test and the pogo block, and determining the occurrence or not of a detect in the device under test or a coupling state of the pogo block on the basis of a second AC signal obtained from at least one of the device under test and the pogo block according to the first AC signal being applied thereto; a second equalizing circuit reducing jitter or noise of the first AC signal to output the jitter or noise-reduced first AC signal to the first equalizing circuit, receiving the second AC signal where jitter or noise thereof has been reduced by the first equalizing circuit, and reducing jitter or noise of the second AC signal; a first driver receiving the first AC signal from the first control unit and inputting the received first AC signal to the second equalizing circuit; and a first receiver receiving the second AC signal from the second equalizing circuit and transferring the received second AC signal to the first control unit.

A direct current (DC) controller, transferring and receiving a DC signal for performing a DC test on at least one of the device under test and the pogo block, may be additionally mounted on the equipment board, and the PLE board may further include a DC signal relay circuit relaying the DC signal transferred and received between the DC controller and the pogo block.

The DC controller may include: a second control unit generating a first DC signal, which is to be applied to at least one of the device under test and the pogo block, and determining the occurrence or not of a detect in the device under test or a coupling state of the pogo block on the basis of a second DC signal obtained from at least one of the device under test and the pogo block according to the first DC signal being applied thereto; a second driver transferring the first DC signal to the DC signal relay circuit; and a second receiver receiving the second DC signal from the DC signal relay circuit and transferring the received second DC signal to the second control unit.

The DC signal relay circuit may include: a DC relay turned on by a control signal to transfer the first DC signal to the pogo block and to transfer the second DC signal to the DC controller; and a bead disposed between the DC relay and the pogo block to prevent the AC signal, transferred and received between the first equalizing circuit and the pogo block, from flowing into the DC relay.

The semiconductor device test apparatus may further include a hi-fix module coupling the probe interface board to the equipment board, wherein the hi-fix module may include: a pair of high-speed connectors connecting the AC controller to the probe interface board, for transferring and receiving the AC signal; and a pair of low-speed connectors connecting the DC controller to the probe interface board, for transferring and receiving the DC signal.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
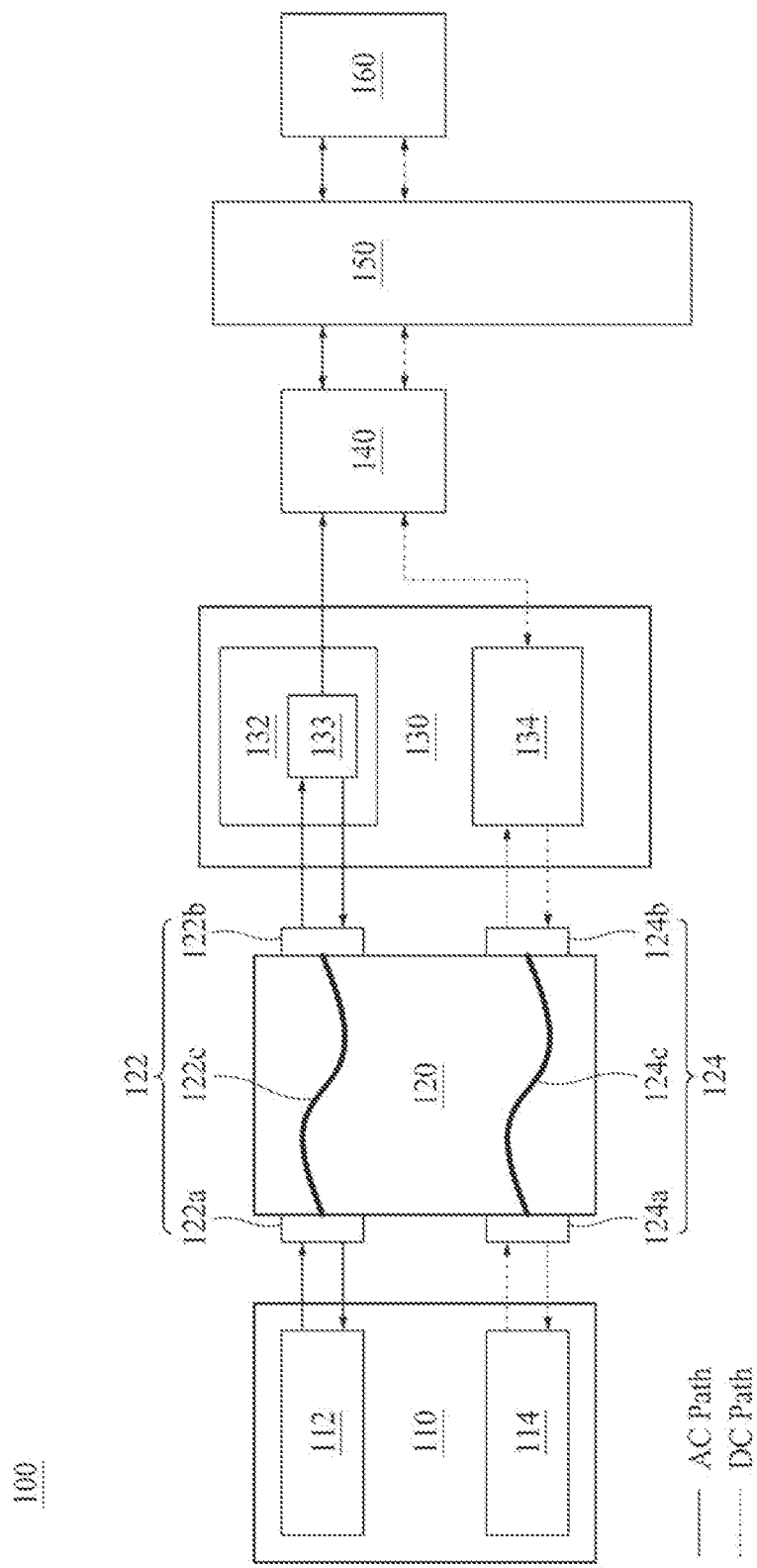
FIG. 1 is a block diagram schematically illustrating a configuration of a semiconductor device test apparatus according to an embodiment of the present invention.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only' is used. The terms of a singular form may include plural forms unless referred to the contrary.

In construing an element, the element is construed as including a detect range although there is no explicit description.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present invention will be described in detail with reference to the accompanying drawings.

FIG. 1 is a block diagram schematically illustrating a configuration of a semiconductor device test apparatus 100 according to an embodiment of the present invention.

As illustrated in FIG. 1, the semiconductor device test apparatus 100 according to an embodiment of the present invention may include an equipment board 110, a hi-fix module 120, a probe interface board 130, and a pogo block 140.

The semiconductor device test apparatus 100 according to an embodiment of the present invention may apply a test signal to a device under test 160 which is electrically connected to the pogo block 140 through a probe card 150, and thus, may test an electrical characteristic of the device under test 160 such as an open/short test or a capacitor capacity test.

Particularly, the semiconductor device test apparatus 100 according to an embodiment of the present invention may generate a test signal for testing the pogo block 140 and may apply the test signal to the pogo block 140, thereby testing a coupling state of the pogo block 140.

The equipment board 110 may generate a test signal for testing at least one of the device under test 160 and the pogo block 140 and may receive a response signal, obtained by applying the test signal, from the device under test 160 and the pogo block 140 to determine the occurrence or not of a defect in the device under test 160 or a coupling state of the pogo block 140.

In FIG. 1, for convenience of description, the semiconductor device test apparatus 100 is illustrated as including one equipment board 110, but is not limited thereto and the semiconductor device test apparatus 100 according to the present invention may include a plurality of equipment boards 110.

As illustrated in FIG. 1, an AC controller 112 and a DC controller 114 may be mounted on the equipment board 110.

The AC controller 112 may perform an AC test on the device under test 160 or the pogo block 140. Hereinafter, a configuration of the AC controller 112 according to the present invention will be described in more detail with reference to FIG. 2.

Figure 2:
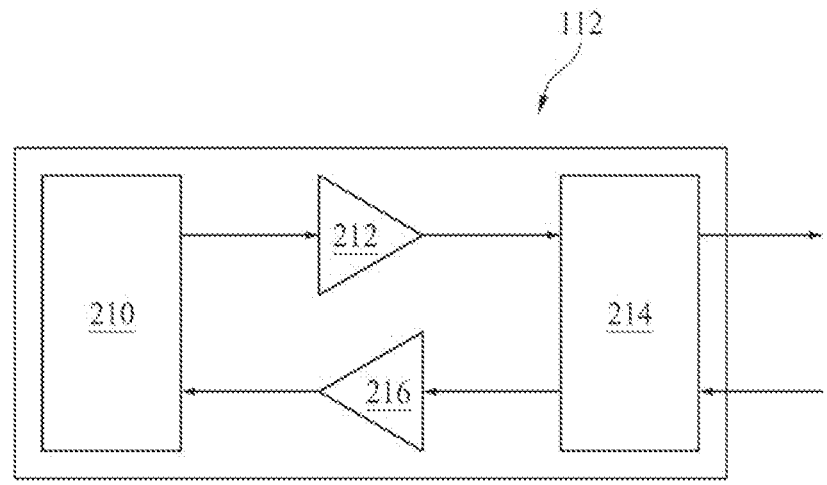
FIG. 2 is a block diagram schematically illustrating a configuration of an AC controller according to an embodiment of the present invention.

FIG. 2 is a block diagram schematically illustrating a configuration of an AC controller 112 according to an embodiment of the present invention. As illustrated in FIG. 2, the AC controller 112 according to an embodiment of the present invention may include a first control unit 210, a first driver 212, a first equalizing circuit 214, and a first receiver 216.

The first control unit 210 may control an overall operation of the AC controller 112. In more detail, the first control unit 210 may generate an AC test signal (hereinafter referred to as a first AC signal), which is to be applied to at least one of the device under test 160 and the pogo block 140, for an AC test performed on at least one of the device under test 160 and the pogo block 140.

Moreover, the first control unit 210 may receive an AC test response signal (hereinafter referred to as a second AC signal), obtained from at least one of the device under test 160 and the pogo block 140 on the basis of the first AC signal being applied thereto, through the first receiver 216 and may determine the occurrence or not of a defect in the device under test 160 or may determine a coupling state of the pogo block 140, on the basis of the received second AC signal. In an embodiment, the first control unit 210 may compare a predetermined expectation value with the second AC signal, and thus, may determine the occurrence or not of a defect in the device under test 160 or may determine a coupling state of the pogo block 140.

The first driver 212 may receive the first AC signal from the first control unit 210 and may input the received first AC signal to the first equalizing circuit 214. In an embodiment, the first driver 212 may amplify the first AC signal and may output the amplified first AC signal to the first equalizing circuit 214.

The first equalizing circuit 214 may decrease jitter or noise in the first AC signal input from the first driver 212, thereby reducing a loss rate of the first AC signal. The first equalizing circuit 214 may output the jitter or noise-reduced first AC signal to a second equalizing circuit 133 of the probe interface board 130.

Moreover, the first equalizing circuit 214 may receive the second AC signal through the probe interface board 130 and the hi-fix module 120 from the second equalizing circuit 133 to decrease jitter or noise, and thus, may reduce a loss rate of the second AC signal. The first equalizing circuit 214 may output the jitter or noise-reduced second AC signal to the first receiver 216. That is, the first equalizing circuit 214 may secondarily reduce jitter or noise in the second AC signal where jitter or noise thereof has been primarily reduced by the second equalizing circuit 133. In the present invention, the reason that the first equalizing circuit 214 secondarily reduces jitter or noise in the second AC signal may be because jitter or noise may again occur in the second AC signal while the second AC signal is passing through first and second high-speed connectors 122a and 122b and a first cable 122c, despite jitter or noise being reduced from the second AC signal by the second equalizing circuit 133.

In an embodiment, the first equalizing circuit 214 may be implemented as a filter circuit for reducing jitter of each of the first AC signal and the second AC signal. In another embodiment, the first equalizing circuit 214 may be implemented as a filter circuit for reducing noise included in each of the first AC signal and the second AC signal.

The second receiver 216 may receive the jitter or noise-reduced second AC signal from the first equalizing circuit 214 and may transfer the received second AC signal to the first control unit 210.

Referring again to FIG. 1, the DC controller 114 may perform a DC test on at least one of the device under test 160 and the pogo block 140. Hereinafter, a configuration of the DC controller 114 according to the present invention will be described in more detail with reference to FIG. 3.

Figure 3:
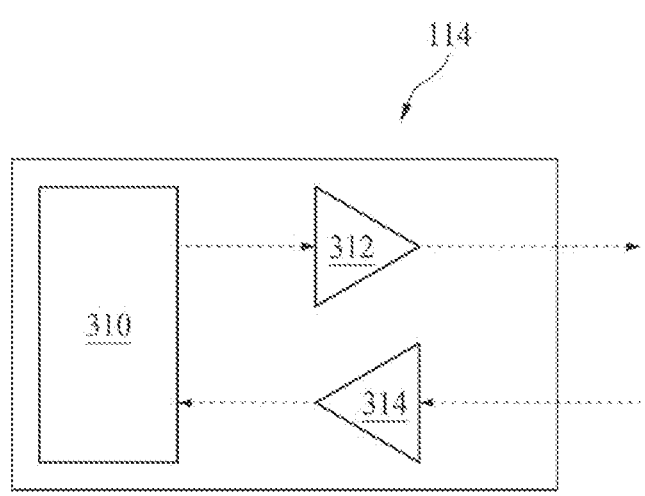
FIG. 3 is a block diagram schematically illustrating a configuration of a DC controller according to an embodiment of the present invention.

FIG. 3 is a block diagram schematically illustrating a configuration of a DC controller 114 according to an embodiment of the present invention.

As illustrated in FIG. 3, the DC controller 114 according to an embodiment of the present invention may include a second control unit 310, a second driver 312, and a second receiver 314.

The second control unit 310 may control an overall operation of the DC controller 114. In more detail, the second control unit 310 may generate a DC test signal (hereinafter referred to as a first DC signal), which is to be applied to at least one of the device under test 160 and the pogo block 140, for a DC test performed on at least one of the device under test 160 and the pogo block 140.

Moreover, the second control unit 310 may receive a DC test response signal (hereinafter referred to as a second DC signal), obtained from at least one of the device under test 160 and the pogo block 140 on the basis of the first DC signal being applied thereto, through the second receiver 314 and may determine the occurrence or not of a defect in the device under test 160 or may determine a coupling state of the pogo block 140, on the basis of the received second DC signal. In an embodiment, the second control unit 310 may compare the predetermined expectation value with the second DC signal, and thus, may determine the occurrence or not of a defect in the device under test 160 or may determine a coupling state of the pogo block 140.

In an embodiment, the second control unit 310 may generate a control signal for controlling a turn-on/off operation of the DC signal relay circuit 134 illustrated in FIG. 1 and may input the generated control signal to the DC signal relay circuit 134.

The second driver 312 may receive the first DC signal from the second control unit 310 and may input the received first DC signal to the DC signal relay circuit 134 through the hi-fix module 120. In an embodiment, the second driver 312 may amplify the first DC signal and may output the amplified first DC signal to the DC signal relay circuit 134.

The second receiver 314 may receive the second DC signal from the DC signal relay circuit 134 and may transfer the received second DC signal to the second control unit 310.

Referring again to FIG. 1, the hi-fix module 120 may be mounted on the equipment board 110. The hi-fix module 120 may interface the probe interface board 130 with the equipment board 110 and may perform a function of supporting the probe interface board 130.

In an embodiment, as illustrated in FIG. 1, the hi-fix module 120 may include the first and second high-speed connectors 122a and 122b, the first cable 122c, first and second low-speed connectors 124a and 124b, and a second cable 124c.

First, the first high-speed connector 122a may connect the AC controller 112 of the equipment board 110 to the hi-fix module 120, and the second high-speed connector 122b may connect the PLE board 132 of the probe interface board 130 to the hi-fix module 120. The first high-speed connector 122a may be connected to the second high-speed connector 122b through the first cable 122c.

Therefore, the first AC signal generated by the AC controller 112 may be transferred to the PLE board 132 of the probe interface board 130 through the first high-speed connector 122a, the first cable 122c, and the second high-speed connector 122b. Also, the second AC signal output from the PLE board 132 may be transferred to the AC controller 112 through the second high-speed connector 122b, the first cable 122c, and the first high-speed connector 122a.

The first low-speed connector 124a may connect the DC controller 114 of the equipment board 110 to the hi-fix module 120, and the second low-speed connector 122b may connect the DC signal relay circuit 134 of the probe interface board 130 to the hi-fix module 120. The first and second low-speed connectors 124a and 124b may be connected to each other through the second cable 124c.

Therefore, the first DC signal generated by the DC controller 114 may be transferred to the DC signal relay circuit 134 of the probe interface board 130 through the first low-speed connector 124a, the second cable 124c, and the second low-speed connector 124b. Also, the second DC signal output from the DC signal relay circuit 134 may be transferred to the DC controller 114 through the second low-speed connector 124b, the second cable 124c, and the first low-speed connector 124a.

The probe interface board 130 may be mounted on the hi-fix module 120. The probe interface board 130 may interface the pogo block 140 with the hi-fix module 120 and may perform a function of supporting the pogo block 140.

The PLE board 132 may be disposed between the probe interface board 130 and the hi-fix module 120 and may reduce a loss rate of each of the first and second AC signals transferred and received between the probe interface board 130 and the hi-fix module 120. To this end, the second equalizing circuit 133 may be mounted on the PLE board 132.

The second equalizing circuit 133 may decrease jitter or noise of the first AC signal received from the AC controller 112 through the hi-fix module 120 and the probe interface board 130, and thus, may reduce a loss rate of the first AC signal. That is, the second equalizing circuit 133 may secondarily reduce jitter or noise in the first AC signal where jitter or noise thereof has been primarily reduced by the first equalizing circuit 214 included in the AC controller 112. In the present invention, the reason that the second equalizing circuit 133 secondarily reduces jitter or noise in the first AC signal may be because jitter or noise may again occur in the first AC signal while the first AC signal is passing through the first and second high-speed connectors 122a and 122b and the first cable 122c, despite jitter or noise being reduced from the first AC signal by the first equalizing circuit 214.

Moreover, the second equalizing circuit 133 may reduce jitter or noise of the second AC signal received from the pogo block 140 through the probe interface board 130, and thus, may decrease a loss rate of the second AC signal. That is, the second equalizing circuit 133 may reduce jitter or noise included in the second AC signal transferred from the pogo block 140. Subsequently, jitter or noise of the second AC signal, where jitter or noise thereof has been primarily reduced by the second equalizing circuit 133, may be secondarily reduced by the first equalizing circuit 214 included in the AC controller 112.

In an embodiment described above, the first equalizing circuit 133 may be implemented as a filter circuit for reducing jitter or noise of each of the first and second AC signals.

Figure 4:
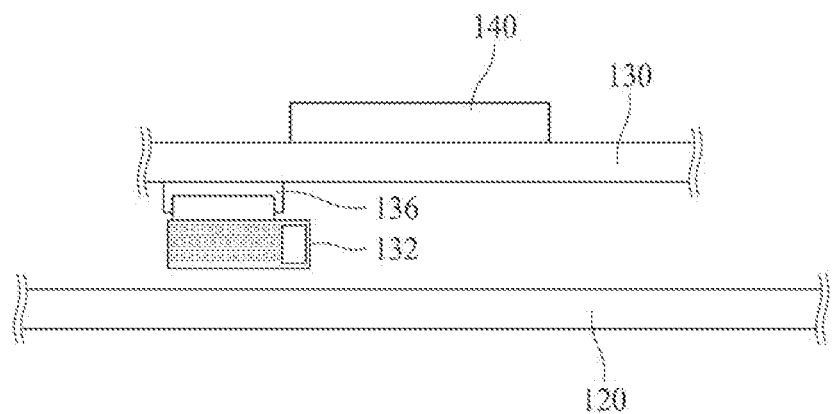
FIG. 4 is a schematic diagram illustrating an example where a PLE board according to an embodiment of the present invention is coupled to a bottom surface of a probe interface board.

In an embodiment, as illustrated in FIG. 4, the PLE board 132 with the second equalizing circuit 133 mounted thereon may be coupled to a bottom surface of the probe interface board 130 in a direction vertical to the probe interface board 130.

In the present invention, the reason that the PLE board 132 is coupled to the bottom surface of the probe interface board 130 in a direction vertical to the probe interface board 130 may be because an installation space may be limited in a case where a plurality of PLE boards 132 are mounted on the probe interface board 130.

To this end, as illustrated in FIG. 4, an edge connector 136 may be coupled to the bottom surface of the probe interface board 130. The PLE board 132 may be inserted into the edge connector 136, and thus, may be coupled to the probe interface board 130 in a direction vertical to the probe interface board 130.

In FIG. 1, it is illustrated that one PLE board 132 is connected to the probe interface board 130, but this is merely for convenience of description and a plurality of PLE boards 132 may be connected to one probe interface board 130. In such an embodiment, the PLE boards 132 may be grouped by predetermined number units, and PLE board groups may be disposed to be symmetrical with respect to a center of the probe interface board 130.

Figure 5:
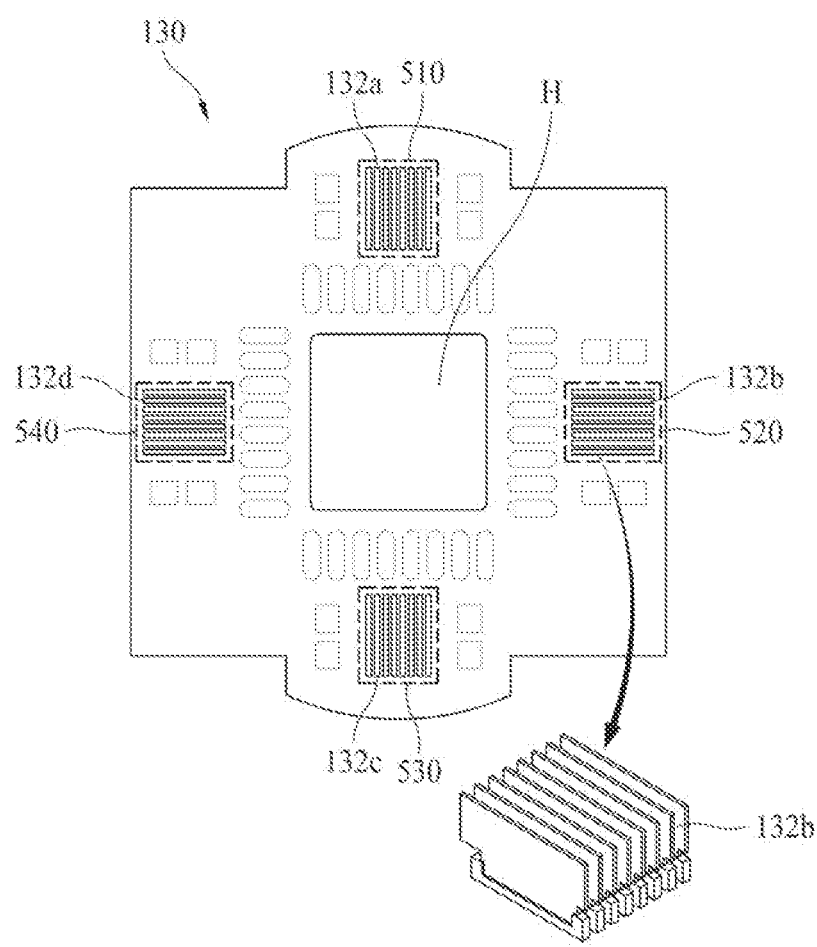
FIG. 5 is a diagram illustrating a region where a PLE board is coupled to a bottom surface of a probe interface board, according to an embodiment of the present invention.

For example, when a plurality of PLE boards 132 are provided, the PLE boards 132 may be grouped into four PLE board groups. In such an embodiment, as illustrated in FIG. 5, with respect to a tetragonal through hole H formed at a center of the probe interface board 130, a first PLE board group 132a may be coupled to a first region 510 which is an outer portion of a first side L1 of the through hole H, a second PLE board group 132b may be coupled to a second region 520 which is an outer portion of a second side L2 of the through hole H, a third PLE board group 132c may be coupled to a third region 530 which is an outer portion of a third side L3 of the through hole H, and a fourth PLE board group 132d may be coupled to a fourth region 540 which is an outer portion of a fourth side L4 of the through hole H.

Figure 6:
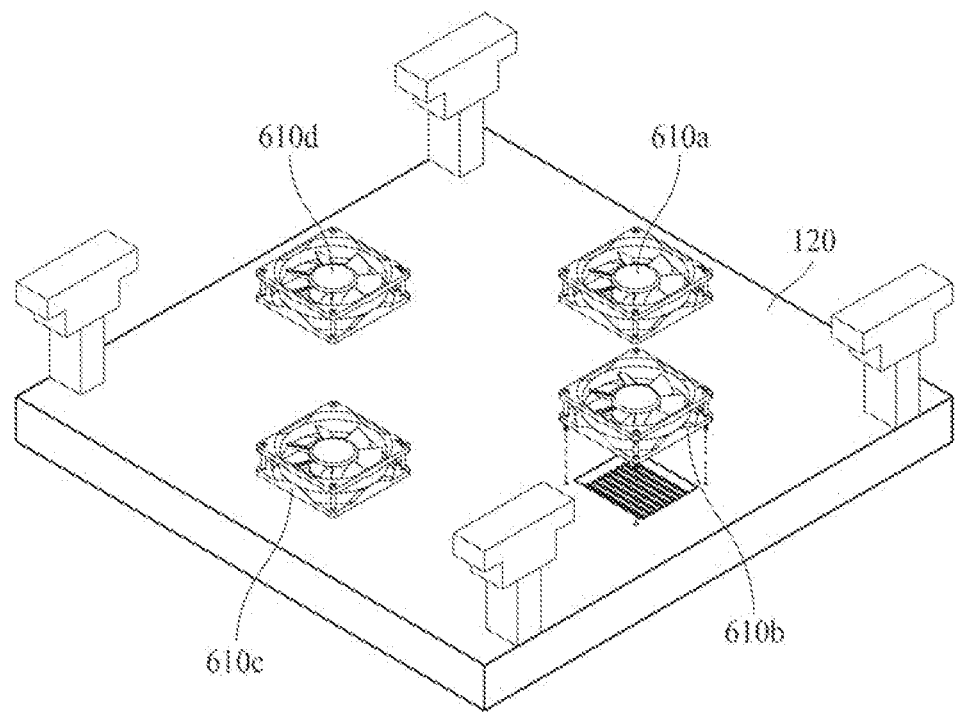
FIG. 6 is a diagram illustrating an example where a heat dissipation fan is coupled to a lower portion of a PLE board.

In an embodiment, the semiconductor device test apparatus 100 according to the present invention may further include a heat dissipation fan for dissipating heat of the PLE boards 132. In this case, the heat dissipation fan may be disposed between the PLE board 132 and the hi-fix module 120. According to such an embodiment, the heat dissipation fan may be provided for each PLE board group. For example, as illustrated in FIG. 6, when the semiconductor device test apparatus 100 includes the first to fourth PLE board groups 132a to 132d, the semiconductor device test apparatus 100 may include a first heat dissipation fan 610 for dissipating heat of the first PLE board group 132a, a second heat dissipation fan 620 for dissipating heat of the second PLE board group 132b, a third heat dissipation fan 630 for dissipating heat of the third PLE board group 132c, and a fourth heat dissipation fan 640 for dissipating heat of the fourth PLE board group 132d.

Referring again to FIG. 1, the DC signal relay circuit 134 for relaying a DC signal transferred and received between the DC controller 114 and the pogo block 140 may be mounted on the probe interface board 130.

Hereinafter, a configuration of the DC signal relay circuit 134 according to an embodiment of the present invention will be described in more detail with reference to FIG. 7.

Figure 7:
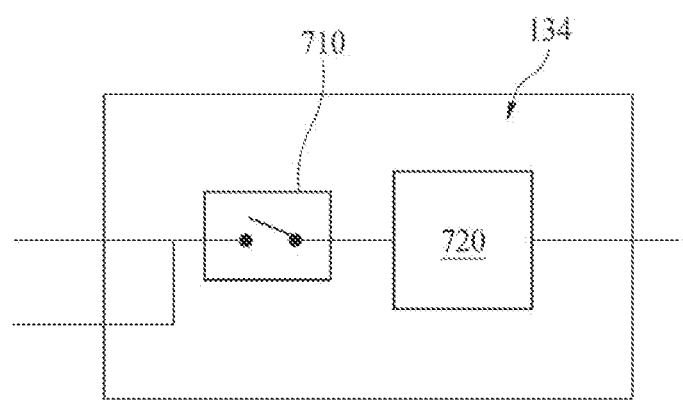
FIG. 7 is a block diagram schematically illustrating a configuration of a DC signal relay circuit illustrated in FIG. 1.

FIG. 7 is a block diagram schematically illustrating a configuration of a DC signal relay circuit 134 according to an embodiment of the present invention. As illustrated in FIG. 7, the DC signal relay circuit 134 may include a DC relay 710 and a bead 720.

The DC relay 710 may be turned on by a control signal and may transfer the first DC signal, input from the DC controller 114, to the pogo block 140 and may transfer the second DC signal, input from the pogo block 140, to the DC controller 114.

In an embodiment, the DC relay 710 may receive the control signal from the second control unit 310 included in the DC controller 114.

The bead 720 may be disposed between the DC relay 710 and the pogo block 140 and may prevent the first and second AC signals, transferred and received between the second equalizing circuit 133 and the pogo block 140, from flowing into the DC relay 710.

Referring again to FIG. 1, the pogo block 140 may be mounted on the probe interface board 130 and may electrically connect the probe interface board 130 to the device under test 160 mounted on the probe card 150. The pogo block 140 may respectively receive the first AC signal and the first DC signal, which are for testing the occurrence or not of a detect in the device under test 160, through an AC signal path and a DC signal path formed in the probe interface board 130 and may transfer the first AC signal and the second AC signal to the device under test 160. Also, the pogo block 140 may receive the second AC signal and the second DC signal obtained based on the first AC signal and the first DC signal being applied from the device under test 160 and may transfer the received second AC signal and second DC signal to the PLE board 132 or the DC signal relay circuit 134 through the AC signal path and the DC signal path formed in the probe interface board 130.

To this end, the pogo block 140 may include an AC signal pin (not shown) for transferring and receiving the first and second AC signals to and from the device under test 160 and a DC signal pin (not shown) for transferring and receiving the first and second DC signals to and from the device under test 160.

Particularly, according to the present invention, when the first AC signal and the first DC signal for testing a coupling state of the pogo block 140 are input, the pogo block 140 may obtain and feed back the second AC signal and the second DC signal based on the first AC signal and the first DC signal, and thus, may enable the AC controller 112 and the DC controller 114 to test a coupling state of the pogo block 140.

The probe card 150 may provide an electrical connection with the pogo block 140 in a state where the device under test 160 is mounted thereon. The probe card 150 may be electrically and physically connected to the device under test 160.

The device under test 160 may be mounted on the probe card 150, and when the first AC signal and the first DC signal are input, the device under test 160 may operate based on the first AC signal and the first DC signal and may output each of the second AC signal and the second DC signal as a result value thereof.

In an embodiment, the device under test 160 may be an SoC. According to such an embodiment, the SoC may be an application processor (AP), a power management integrated circuit (PMIC), a display driver integrated circuit (DDIC), a power IC, or a CMOS image sensor (CIS) on the basis of the kinds of non-volatile memory semiconductors, but the SoC may be in a wafer state, or may be in a chip package state.

As described above, according to the present invention, a loss rate of an AC signal may be improved through two-step equalizing, and particularly, the PLE board 132 including the second equalizing circuit 133 may be installed in the probe interface board 130 adjacent to the device under test 160. Accordingly, the improvement of the loss rate of the AC signal may be maximized, and thus, the signal integrity (SI) of the AC signal may be enhanced.

Figure 8:
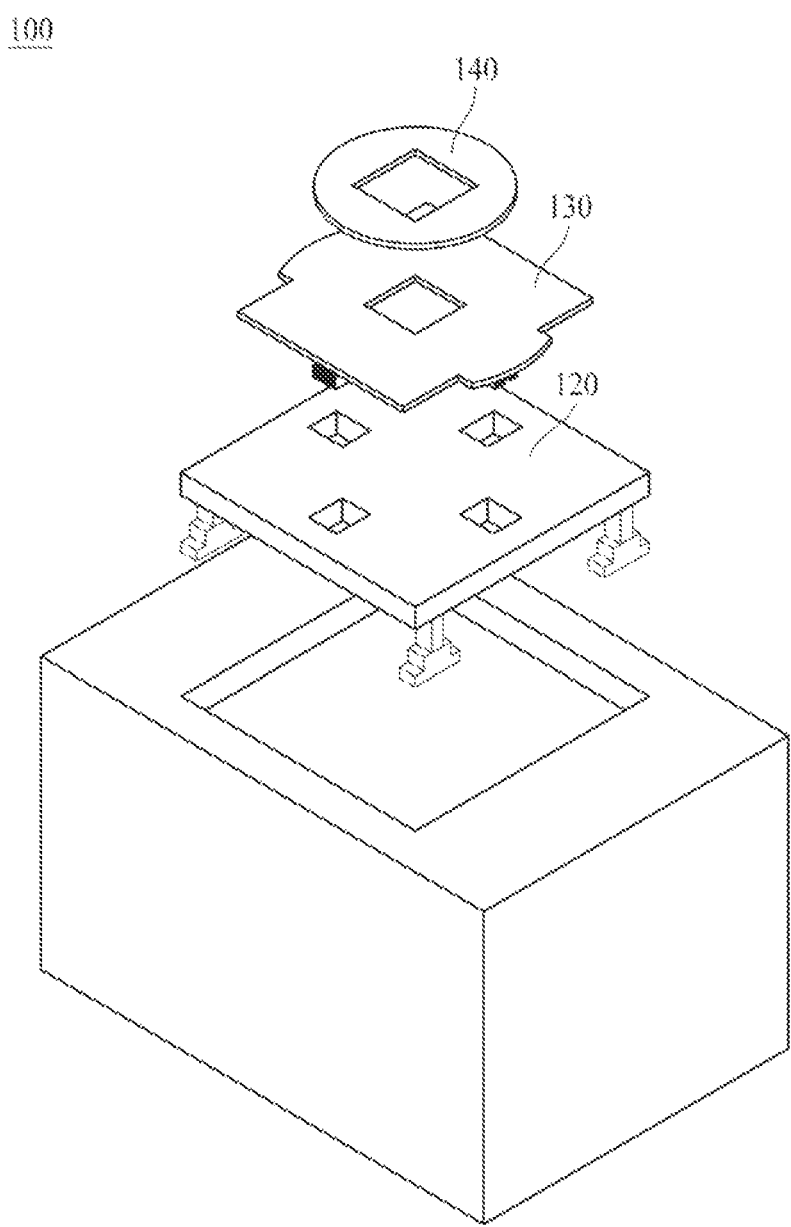
FIG. 8 is a diagram illustrating an exploded perspective view of a semiconductor device test apparatus according to an embodiment of the present invention.

FIG. 8 is a diagram illustrating an exploded perspective view of a semiconductor device test apparatus according to an embodiment of the present invention. As illustrated in FIG. 8, according to an embodiment of the present invention, the hi-fix module 120, the probe interface board 130, and the pogo block 140 may be sequentially mounted on an equipment board (not shown), and the PLE board 132 may be mounted on the bottom surface of the probe interface board 130 facing the hi-fix module 120.

According to the embodiments of the present invention, a PLE board for decreasing the jitter or noise of a test signal may be coupled to a probe interface board, and thus, may reduce the jitter or noise of the test signal at a position closest to a device under test, thereby improving a loss rate of the test signal.

Moreover, according to the embodiments of the present invention, because the PLE board further includes an equalizing circuit in addition to an equalizing circuit included in an AC controller, the jitter or noise of the test signal may be removed through two steps, and thus, the improvement of a loss rate of the test signal may be maximized.

Moreover, according to the embodiments of the present invention, the PLE board may be vertically coupled to a bottom surface of the probe interface board, and thus, a plurality of PLE boards may be mounted in a limited space, thereby miniaturizing a semiconductor device test apparatus.

Moreover, according to the embodiments of the present invention, a coupling state of a pogo block may be tested by performing an AC test and a DC test on the pogo block as well as a device under test, thereby enhancing the reliability of a test result.

Moreover, according to the embodiments of the present invention, a bead may be added to a DC signal relay circuit for a DE test, and thus, an AC signal for an AC test may be prevented from flowing into a DC signal relay circuit, thereby enhancing the accuracy of a DC test result.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A semiconductor device test apparatus comprising:
a probe interface board;
a pogo block disposed on the probe interface board and electrically connected to a device under test;
an equipment board disposed under the probe interface board, an alternating current (AC) controller, transferring and receiving an AC signal for performing an AC test on at least one of the device under test and the pogo block, being mounted on the equipment board; and
a physical layer equalizing (PLE) board disposed between the probe interface board and the equipment board, a first equalizing circuit, decreasing loss of the AC signal, being mounted on the PLE board.

2. The semiconductor device test apparatus of claim 1, further comprising an edge connector coupled to a bottom surface of the probe interface board,
wherein the PLE board is inserted into the edge connector in a direction vertical to the probe interface board.

3. The semiconductor device test apparatus of claim 1, wherein
the PLE board is provided in plurality, and
the plurality of PLE boards are grouped by predetermined number units and are disposed in a symmetrical structure with respect to a center of the probe interface board.

4. The semiconductor device test apparatus of claim 3, wherein
a through hole having a tetragonal shape is formed in a center of the probe interface board,
the plurality of PLE boards are grouped into a first PLE board group, a second PLE board group, a third PLE board group, and a fourth PLE board group, and
the first PLE board group is coupled to a first region which is an outer portion of a first side of the through hole in the probe interface board, a second PLE board group is coupled to a second region which is an outer portion of a second side of the through hole in the probe interface board, a third PLE board group is coupled to a third region which is an outer portion of a third side of the through hole in the probe interface board, and a fourth PLE board group is coupled to a fourth region which is an outer portion of a fourth side of the through hole in the probe interface board.

5. The semiconductor device test apparatus of claim 3, further comprising a heat dissipation fan disposed between the plurality of PLE boards and the equipment board to dissipate heat of a PLE board included in a corresponding group for each group.

6. The semiconductor device test apparatus of claim 1, wherein the first equalizing circuit is a filter circuit reducing jitter or noise of the AC signal.

7. The semiconductor device test apparatus of claim 1, wherein the AC controller comprises:
a first control unit generating a first AC signal, which is to be applied to at least one of the device under test and the pogo block, and determining the occurrence or not of a detect in the device under test or a coupling state of the pogo block on the basis of a second AC signal obtained from at least one of the device under test and the pogo block according to the first AC signal being applied thereto;
a second equalizing circuit reducing jitter or noise of the first AC signal to output the jitter or noise-reduced first AC signal to the first equalizing circuit, receiving the second AC signal where jitter or noise thereof has been reduced by the first equalizing circuit, and reducing jitter or noise of the second AC signal;
a first driver receiving the first AC signal from the first control unit and inputting the received first AC signal to the second equalizing circuit; and
a first receiver receiving the second AC signal from the second equalizing circuit and transferring the received second AC signal to the first control unit.

8. The semiconductor device test apparatus of claim 1, wherein
a direct current (DC) controller, transferring and receiving a DC signal for performing a DC test on at least one of the device under test and the pogo block, is additionally mounted on the equipment board, and
the PLE board further comprises a DC signal relay circuit relaying the DC signal transferred and received between the DC controller and the pogo block.

9. The semiconductor device test apparatus of claim 8, wherein the DC controller comprises:
a second control unit generating a first DC signal, which is to be applied to at least one of the device under test and the pogo block, and determining the occurrence or not of a detect in the device under test or a coupling state of the pogo block on the basis of a second DC signal obtained from at least one of the device under test and the pogo block according to the first DC signal being applied thereto;

a second driver transferring the first DC signal to the DC signal relay circuit; and a second receiver receiving the second DC signal from the DC signal relay circuit and transferring the received second DC signal to the second control unit.

10. The semiconductor device test apparatus of claim 9, wherein the DC signal relay circuit comprises:

a DC relay turned on by a control signal to transfer the first DC signal to the pogo block and to transfer the second DC signal to the DC controller; and a bead disposed between the DC relay and the pogo block to prevent the AC signal, transferred and received between the first equalizing circuit and the pogo block, from flowing into the DC relay.

11. The semiconductor device test apparatus of claim 8, further comprising a hi-fix module coupling the probe interface board to the equipment board, wherein the hi-fix module comprises:

a pair of high-speed connectors connecting the AC controller to the probe interface board, for transferring and receiving the AC signal; and a pair of low-speed connectors connecting the DC controller to the probe interface board, for transferring and receiving the DC signal.

\* \* \* \* \*